United States Patent [19]

Pike et al.

[11] 4,055,801
[45] Oct. 25, 1977

[54] AUTOMATIC ELECTRONIC TEST EQUIPMENT AND METHOD

[76] Inventors: Harold L. Pike, R.R. No. 2, Box 134, Castle Rock, Colo. 80104; G. Lamar Thomas, 368 W. Powers Ave., Apt. 201, Littleton, Colo. 80120; Ronald L. Ketchum, 3555 S. Pennsylvania; John F. Evans, 4135 S. Hazel Court, both of Englewood Colo. 80110.

[21] Appl. No.: 64,703

[22] Filed: Aug. 18, 1970

[51] Int. Cl.² ............................................. G01R 15/12
[52] U.S. Cl. ............................ 324/73 R; 324/73 AT
[58] Field of Search .......................... 324/73 R, 73 AT

[56] References Cited
U.S. PATENT DOCUMENTS 3,546,582  12/1970  Barnard .......................... 324/73 R

*Primary Examiner*—Rudolph V. Rolinec
*Assistant Examiner*—Vincent J. Sunderdick
*Attorney, Agent, or Firm*—Gay Chin; James B. Eisel

[57] ABSTRACT

A method and apparatus for the automatic testing of electronic equipment in which a general purpose digital computer is programmed for the equipment to be tested to generate appropriate stimulus waveforms for application to the equipment to be tested and for the measurement and evaluation of the waveforms responsively generated by the equipment tested. The computer directly controls the point-by-point generation of the analog stimulus waveforms by a plurality of analog to digital and analog to synchro converters, the application of the stimulus waveforms to selected leads of the unit to be tested, and the application of the response waveforms to a selected measurement circuit for conversion to digital form for subsequent evaluation by the computer against programmed standards.

12 Claims, 16 Drawing Figures

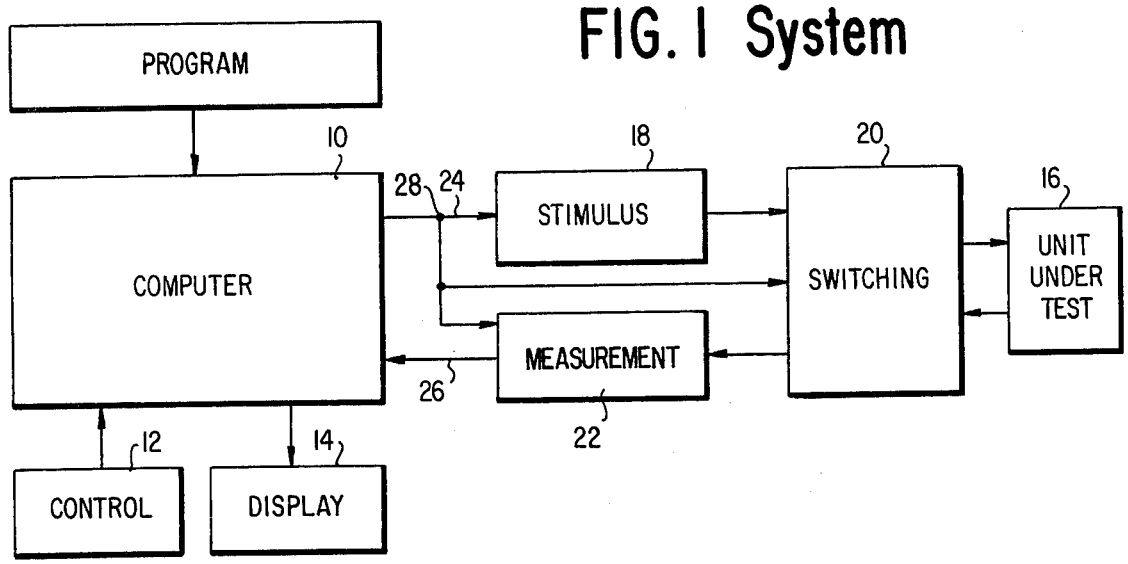
FIG. 1 System
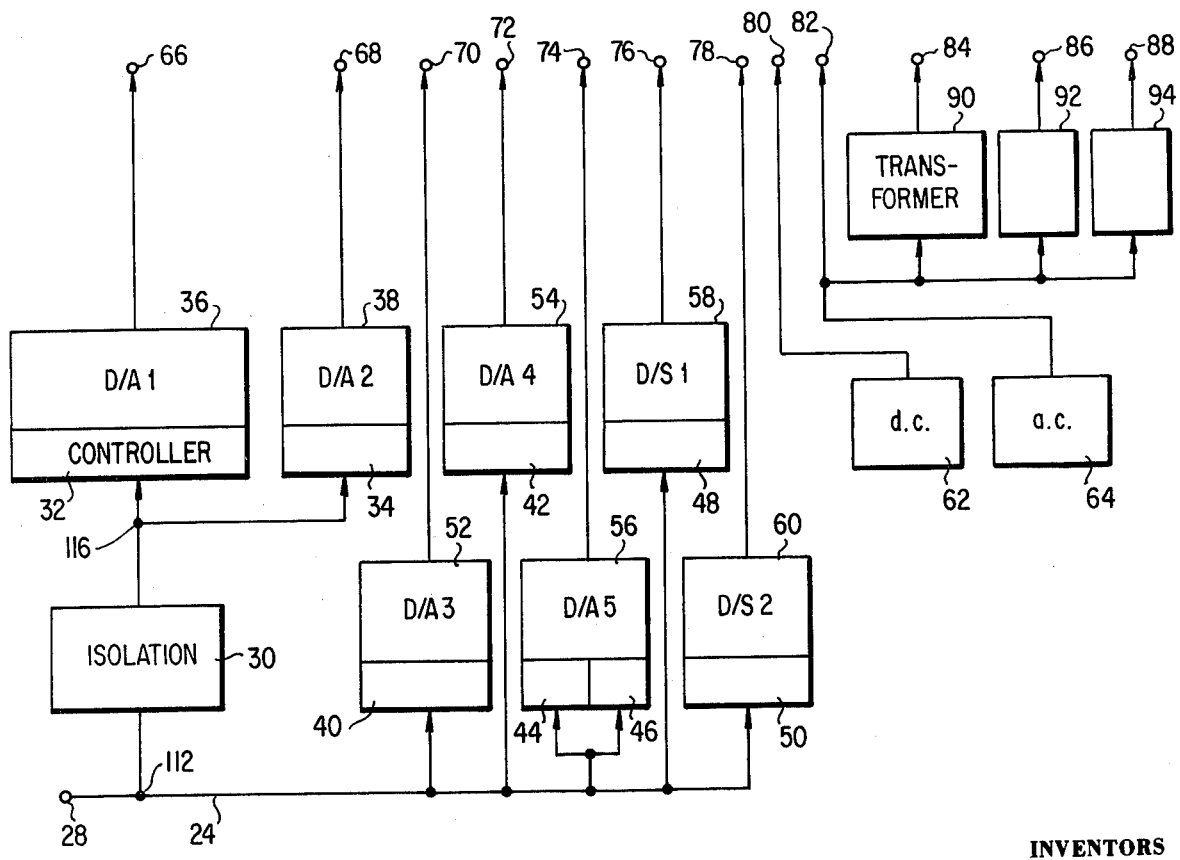
FIG. 2 Stimulus Unit
INVENTORS
HAROLD C. PIKE
G. LAMAR THOMAS
RONALD C. KETCHUM
JOHN F. EVANS
ATTORNEYS

FIG. 3 Isolation
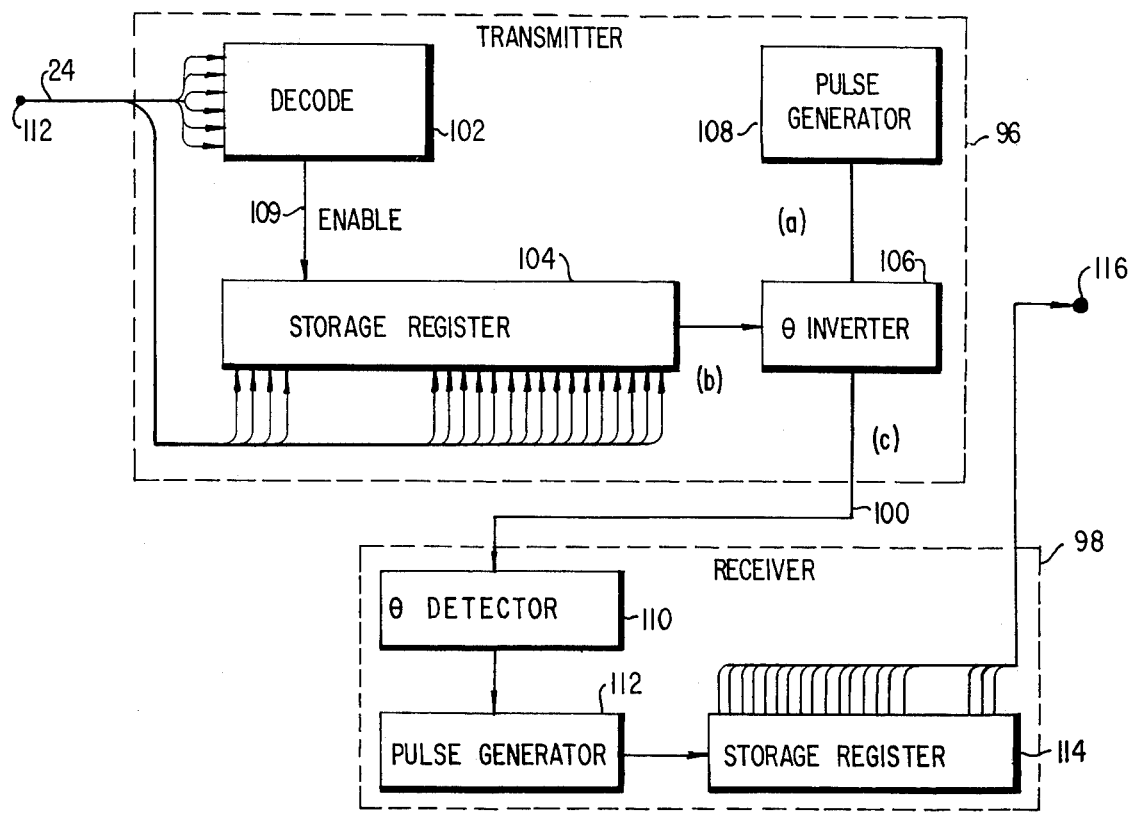
FIG. 3(A)
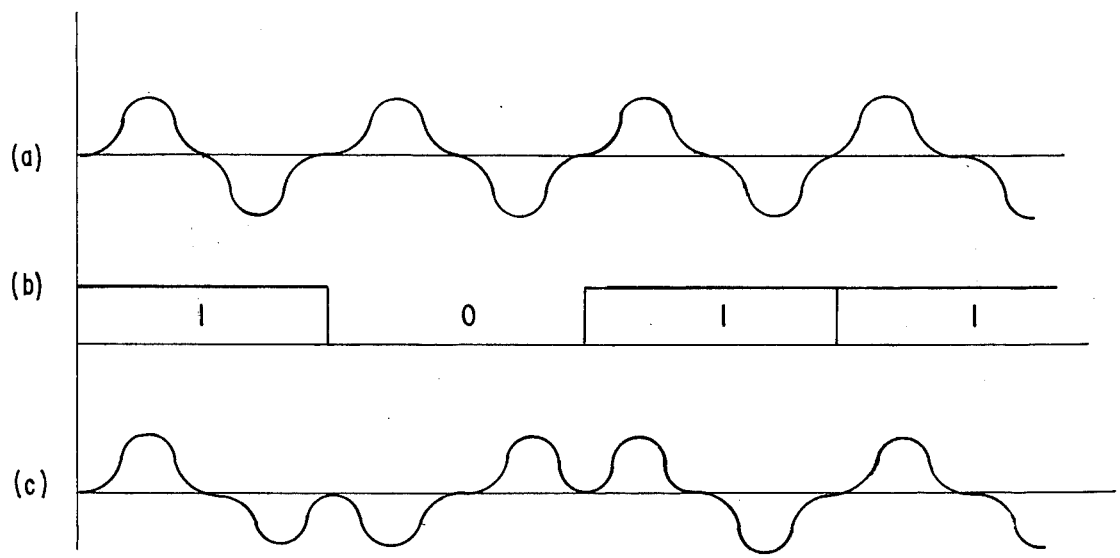

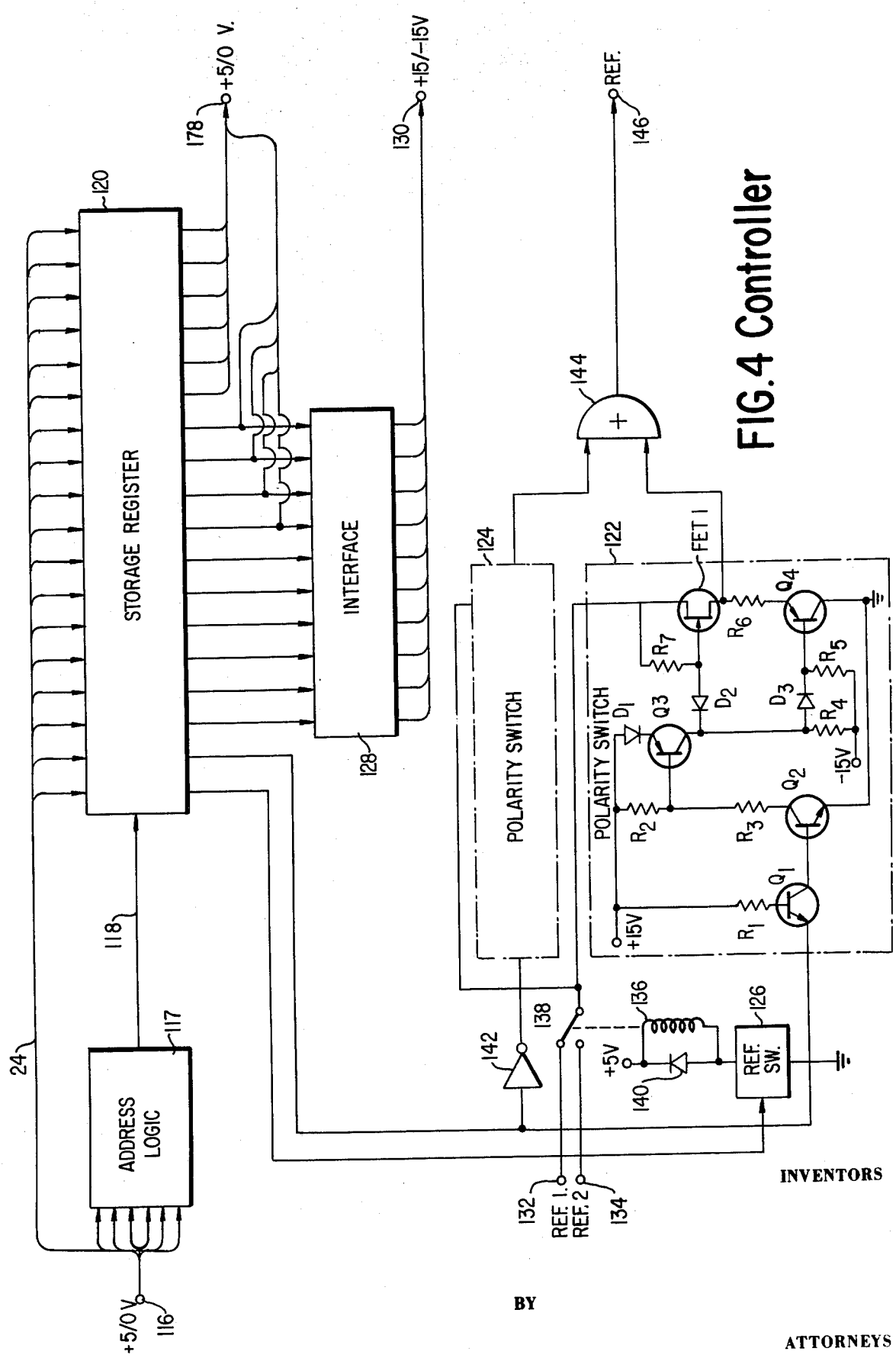
FIG.4 Controller

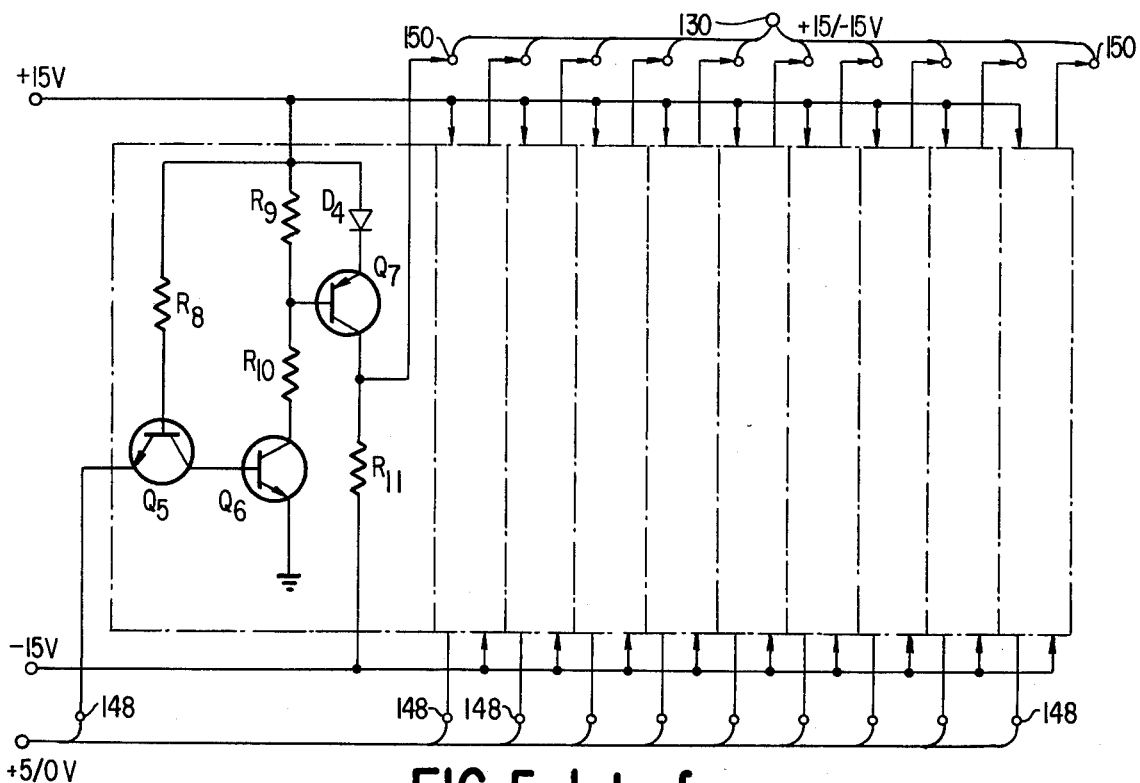
FIG. 5 Interface
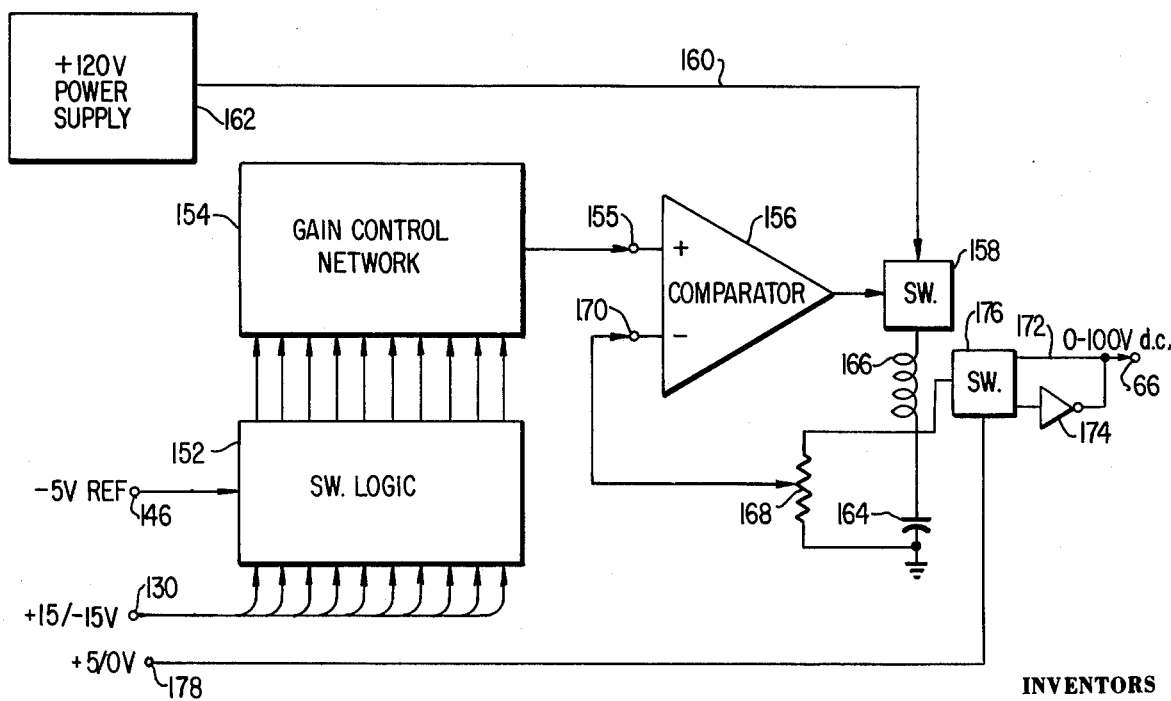
FIG. 6 D/A 1

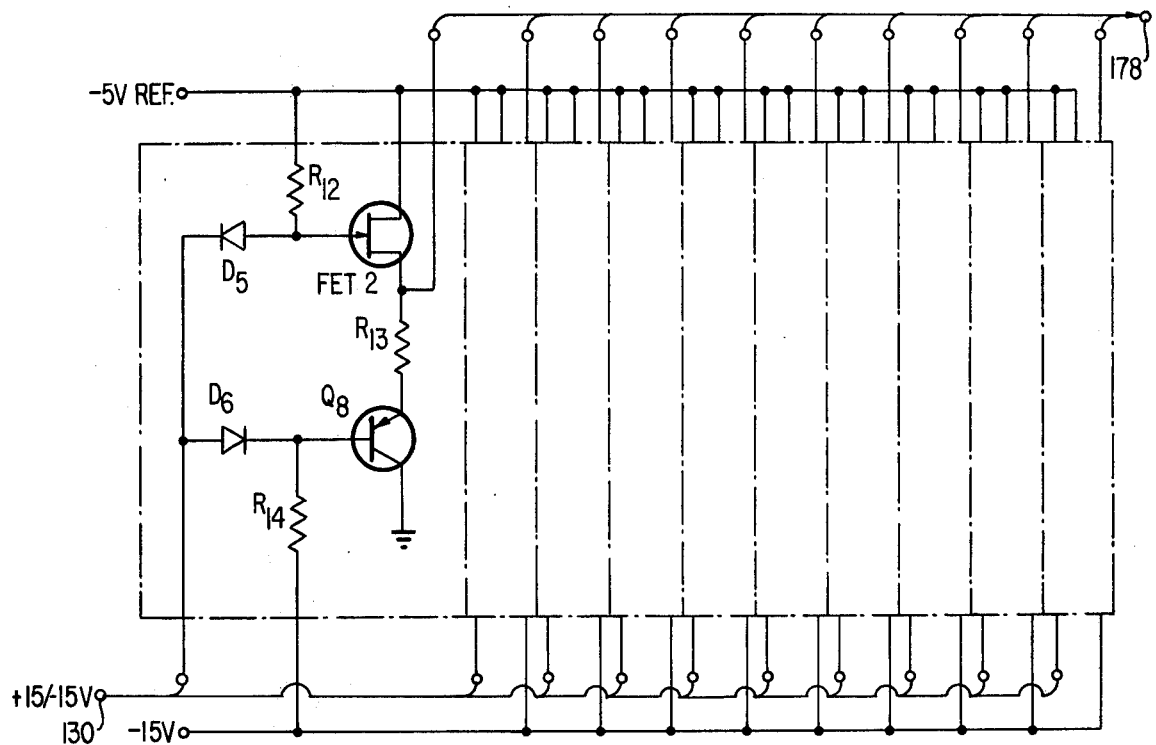
FIG. 7 Switch Logic
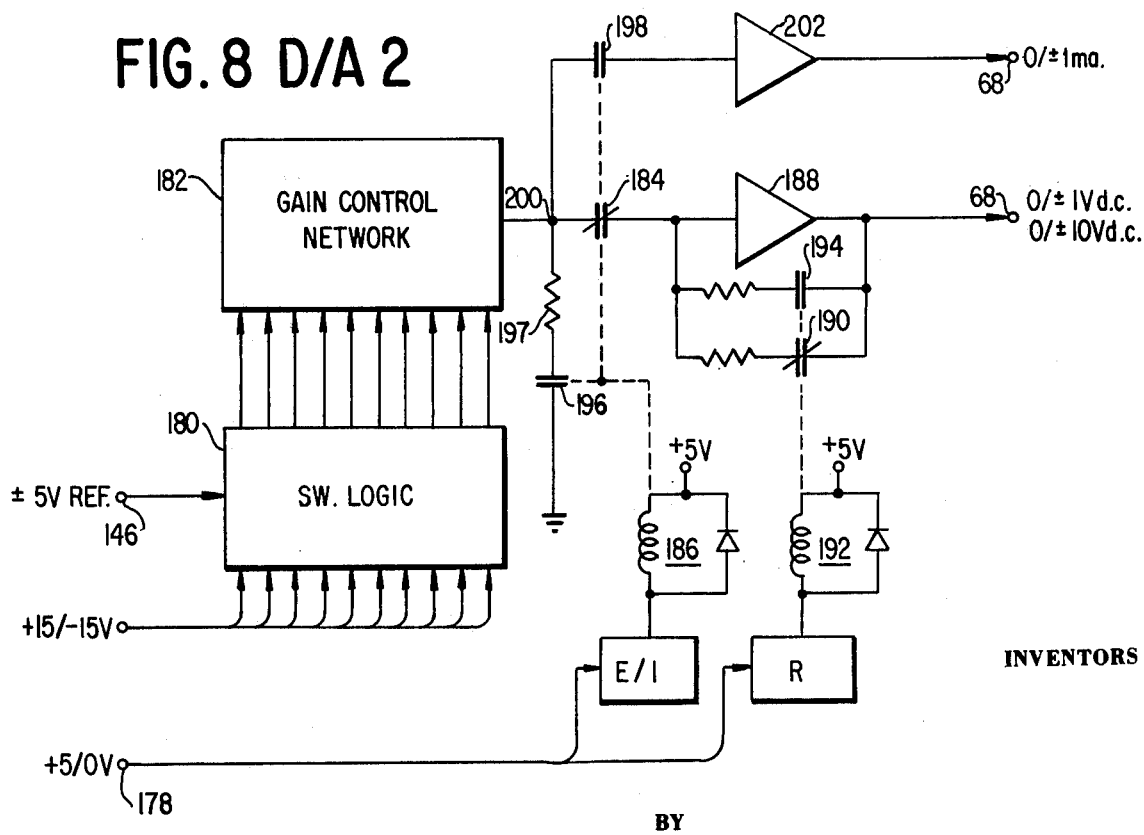
FIG. 8 D/A 2

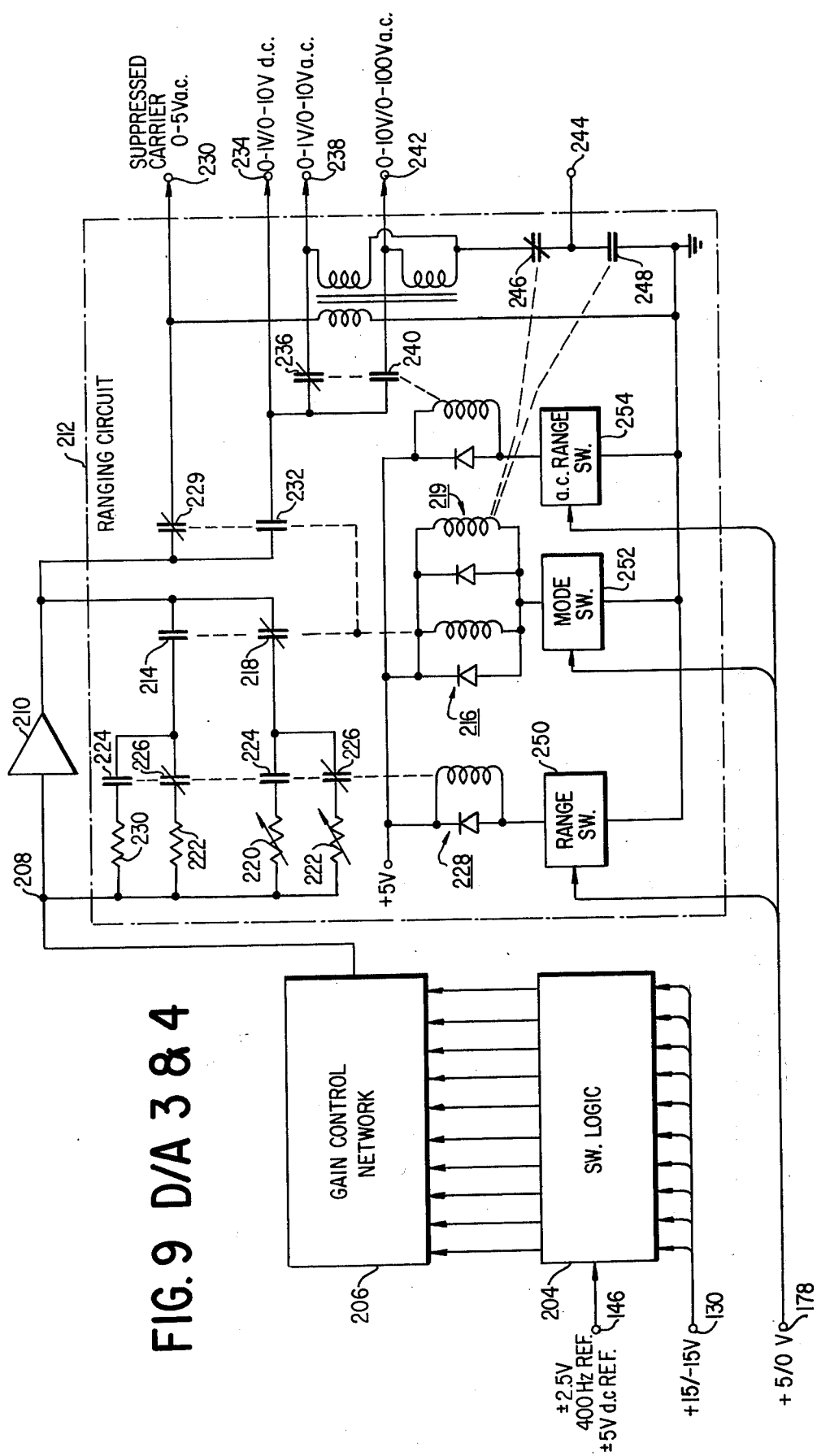
FIG. 9 D/A 3 & 4

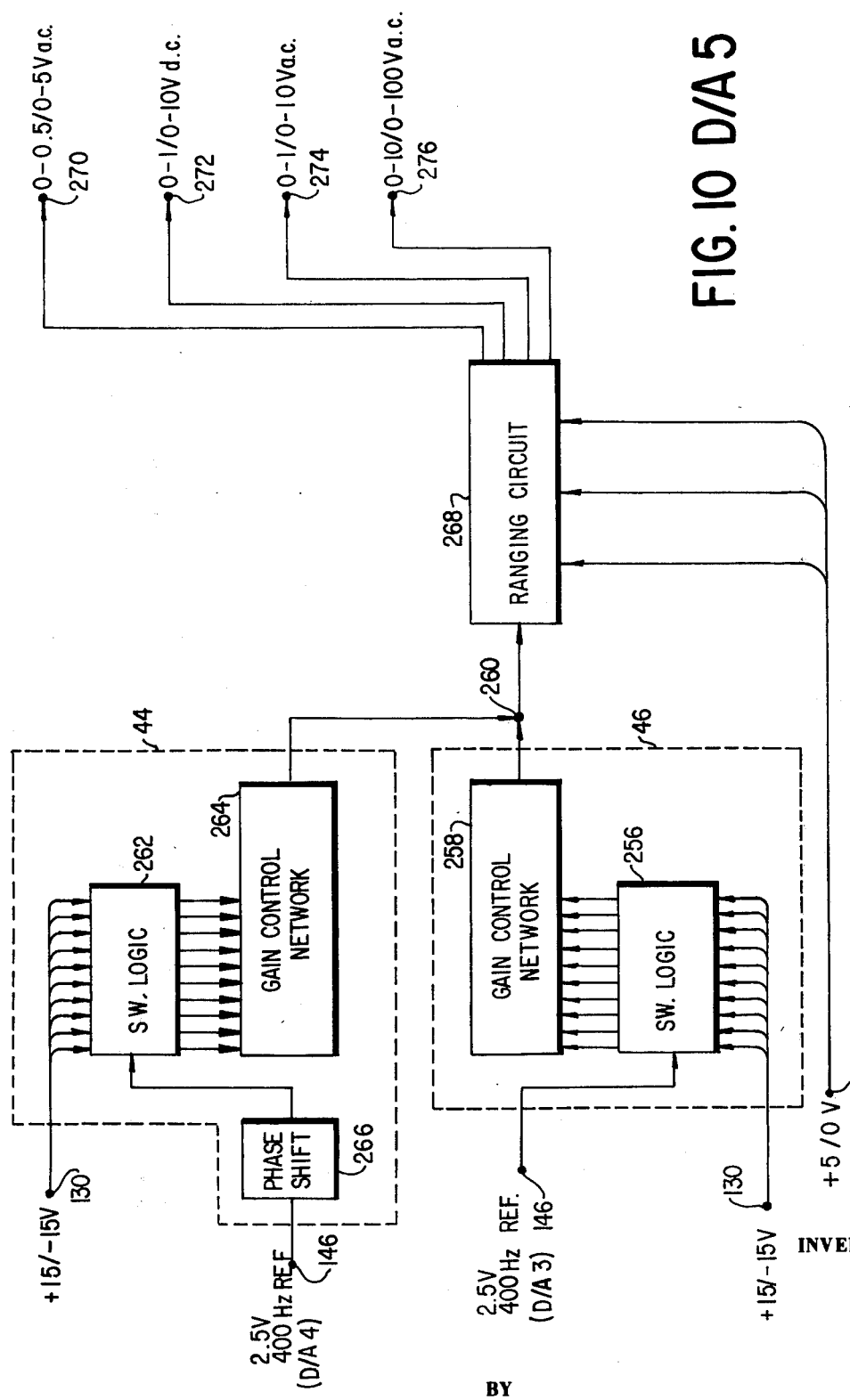
FIG. 10 D/A 5

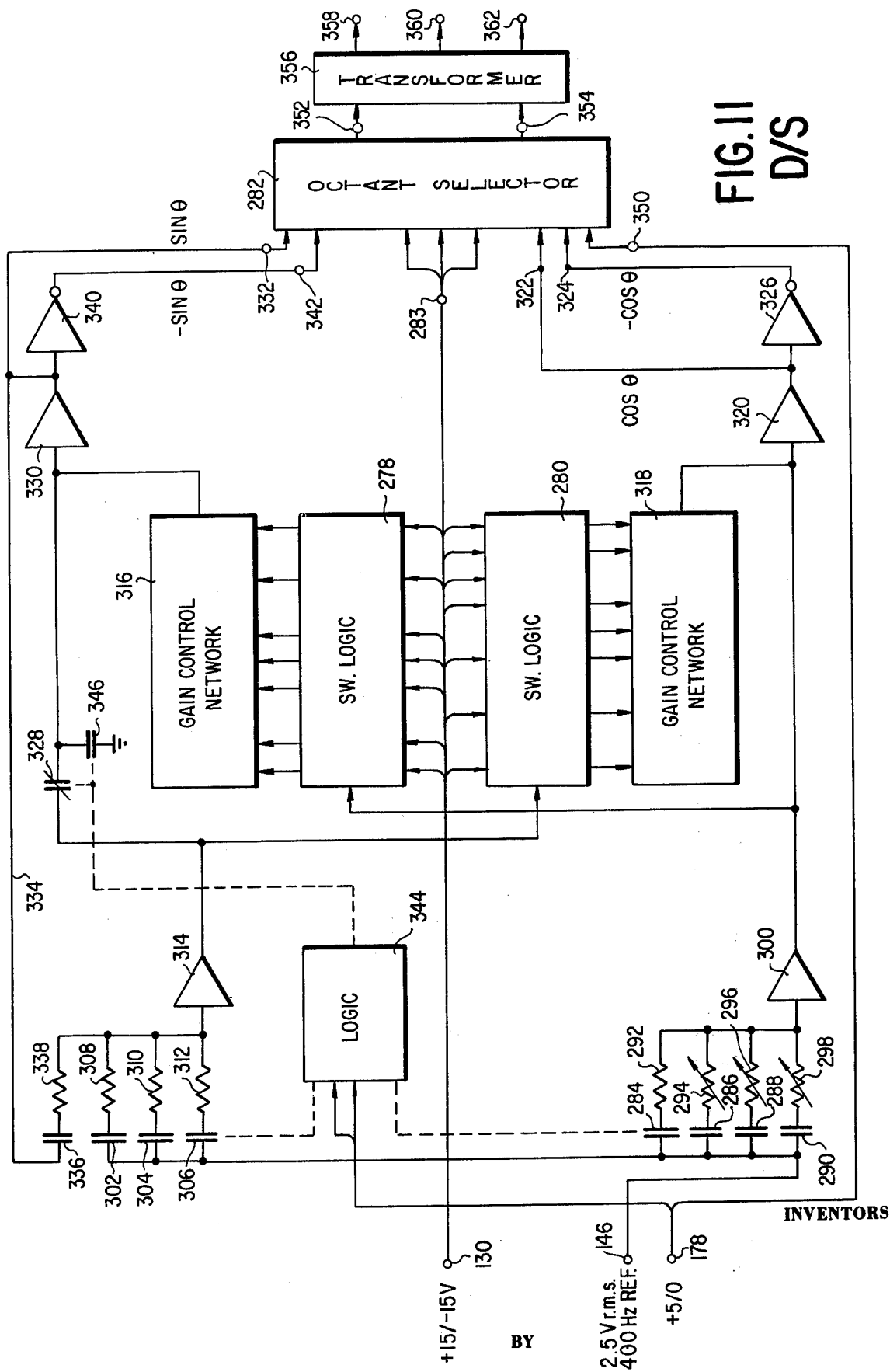
FIG.11 D/S

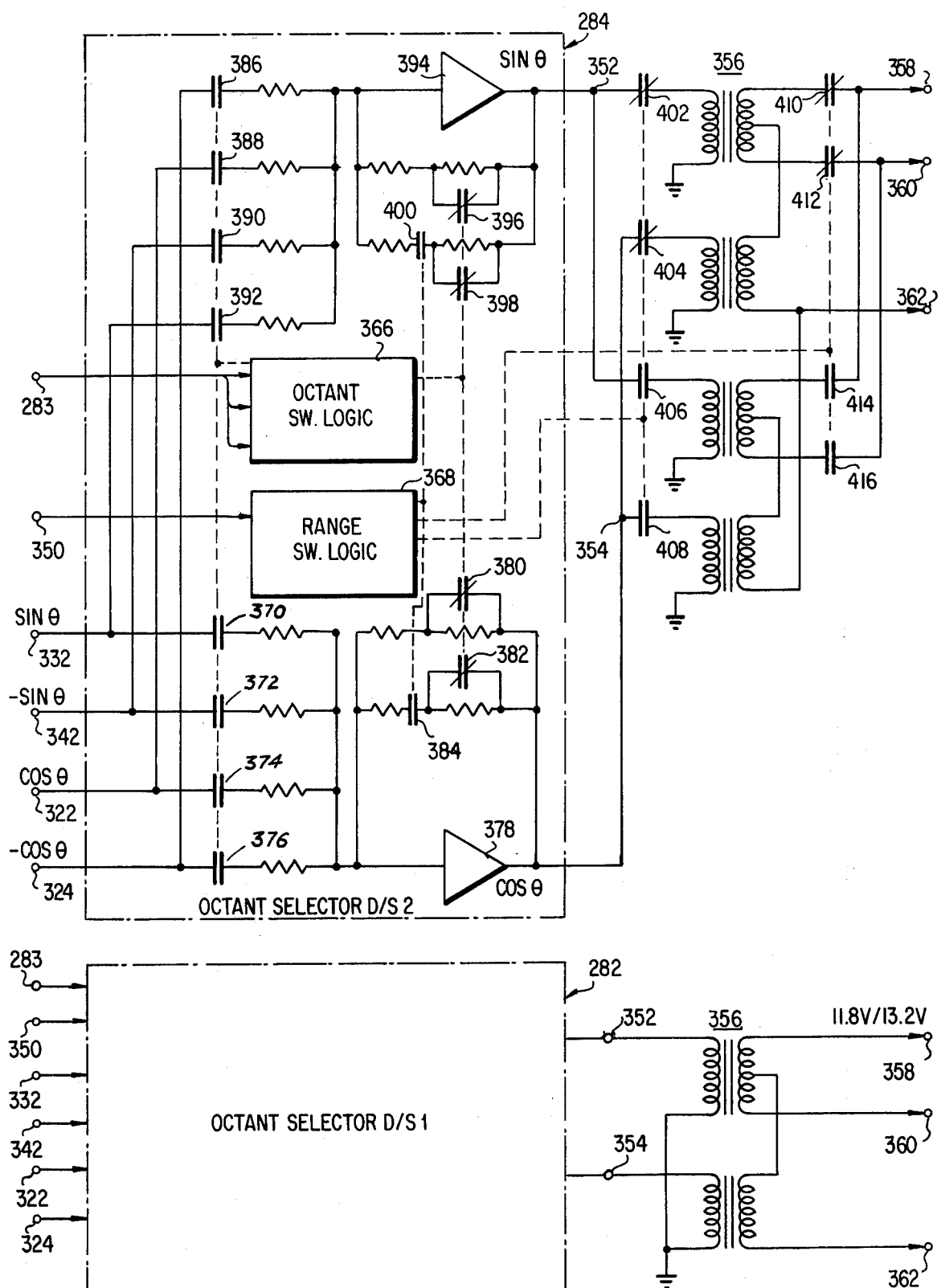
FIG. 12 Octant Selector & Transformer

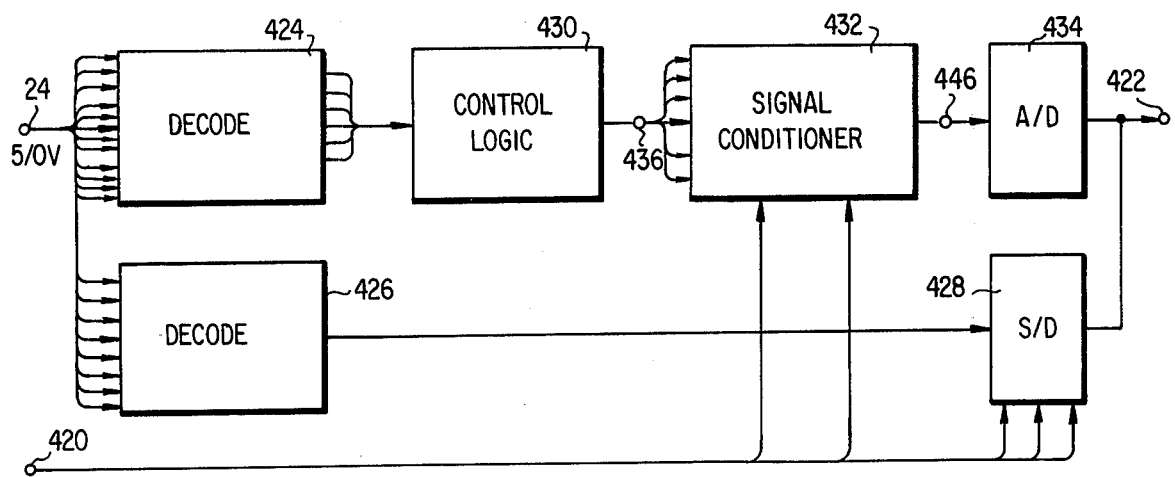
FIG. 13 Measurement Unit
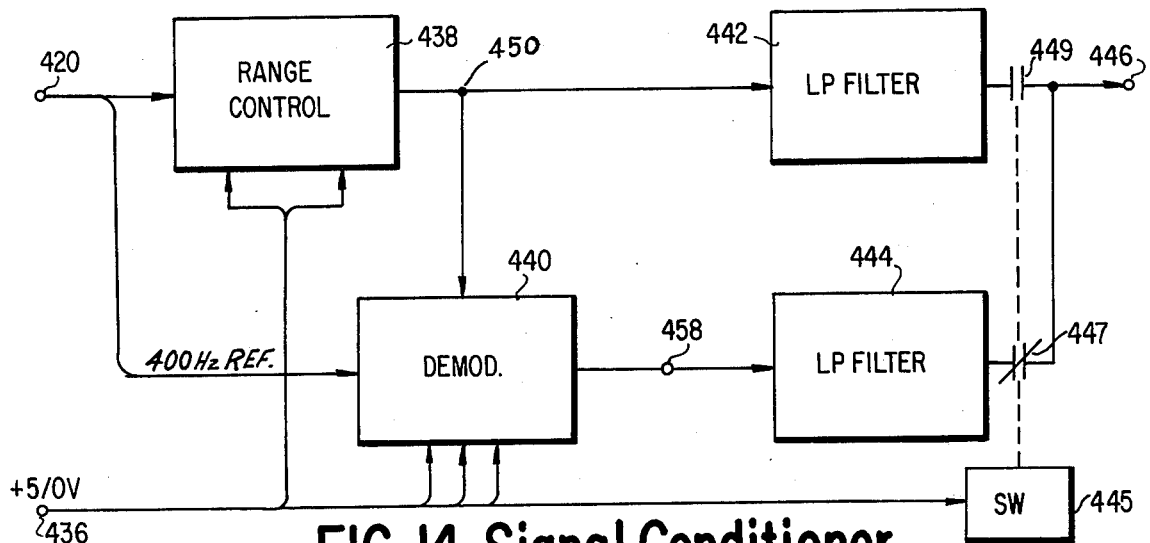
FIG. 14 Signal Conditioner
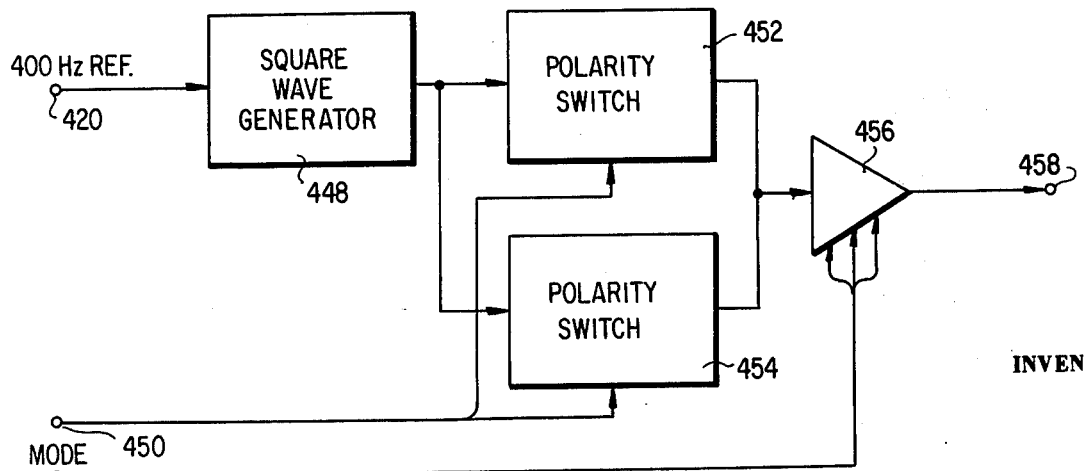
FIG. 15 Demodulator

AUTOMATIC ELECTRONIC TEST EQUIPMENT AND METHOD

BACKGROUND OF THE INVENTION

The subject invention relates to the automatic testing of electronic equipment and more specifically to a method and apparatus for evaluating the performance of electronic equipment.

The prior art approach to the automatic testing of electronic equipment has generally utilized a general purpose digital computer programmed by means of punched cards, magnetic tape, or the like, with information relative to the selection of one of a plurality of waveform generators, the interconnections between the selected waveform generator and an output terminal to which the equipment to be tested is connected, and the selective interconnection of the output terminal to one of a plurality of evaluation circuits for evaluation of the waveforms generated in the electronic equipment in response to the application of the waveforms applied. Systems of this type are inherently limited by the number of different waveform or function generators and by the number of different evaluation circuits provided. As the electronic systems to be tested grow in complexity, the number of function generators and the number of evaluation circuits also increase, resulting in larger and larger, and correspondingly more expensive, test installations.

It is accordingly a primary object of the present invention to provide a novel method and apparatus for the automatic checkout, or testing, of electronic equipment which obviates the necessity for large numbers of function generators and evaluation circuits. This object is accomplished by programming a general purpose digital computer both for numeric waveform generation and for the evaluation of the response waveforms generated by the equipment tested.

A further object of the present invention is to provide a novel method and apparatus for the utilization of a general purpose digital computer to fully integrate all of the functional electronics in the automatic testing of electronic equipment.

It is another object of the present invention to provide a novel method and apparatus with infinite expansion possibilities both as to measurement and the stimulation of the equipment to be tested with a relatively small increase in test equipment, and which minimizes the expense of test labor costs through faster testing with fewer people.

It is yet another object of the present invention to provide a novel method and apparatus for utilizing a general purpose digital computer to control all system sequencing; signal interfacing; power application to the unit under test; control of peripheral components such as printers, memory and assorted display units; responsive waveform processing without special hardware; and the evaluation of the response waveforms against limits for the appropriate unit to be tested.

THE DRAWINGS

FIG. 1 is a functional block diagram of the overall system of the present invention;

FIG. 2 is a functional block diagram of the stimulus unit of FIG. 1;

FIG. 3 is a functional block diagram of the isolation circuit of the stimulus unit of FIG. 2;

FIG. 3 (A) is a timing diagram of the waveforms at various points in the block diagram of FIG. 3;

FIG. 4 is a functional block diagram of the controller of FIG. 2;

FIG. 5 is a schematic circuit diagram of the interface circuit of FIG. 4;

FIG. 6 is a functional block diagram of the digital to analog converter No. 1 (D/A 1) of FIG. 1;

FIG. 7 is a schematic circuit diagram of the switch logic of FIG. 6;

FIG. 8 is a functional block diagram of the digital to analog converter No. 2 (D/A 2) of FIG. 2;

FIG. 9 is a schematic circuit diagram of the digital to analog converters Nos. 3 and 4 (D/A3 and D/A 4) of FIG. 2;

FIG. 10 is a schematic circuit diagram of the digital to analog converter No. 5 (D/A 5) of FIG. 2;

FIG. 11 is a schematic circuit diagram of the digital to synchro converters Nos. 1 and 2 (D/S 1 and D/S 2) of FIG. 2;

FIG. 12 is a schematic circuit diagram of the octant selector and transformer of FIG. 11;

FIG. 13 is a functional block diagram of the evaluation circuit of FIG. 1;

FIG. 14 is a functional block diagram of the signal conditioning circuit of FIG. 13; and FIG. 15 is a functional block diagram of the demodulator of FIG. 14.

DETAILED DESCRIPTION OF A PREFERRED EMBODIMENT

With reference now to FIG. 1, a general purpose digital computer 10 is provided with suitable conventional control unit 12 interconnected therewith to provide manual control of the programming of the computer and the computer as programmed. The control unit 12 may comprise keyboard apparatus and/or other conventional input mechanisms operable manually by an operator.

Also shown schematically in FIG. 1 is a display unit 14 adapted to receive the display data from the computer 10. The data displayed may relate to the operation of the unit 16 under test and/or the condition of the remaining units in the system. The individual units in the display section may comprise any suitable conventional display apparatus such as typewriters, status/alarm lights, pen recorders, or the like, and may be utilized to cue the operator in the use of the control unit 12 in the operation of the system to test the unit 16.

The computer 10 may be programmed in any suitable conventional manner such as by means of apertured cards, tapes, or the like in conformance with the particular piece of equipment to be tested. The test routine includes data relating to the waveforms to be generated by the stimulus unit 18, the routing of the generated stimulus signals through the switching unit 20 to the unit 16 under test, the routing of the signals produced by the unit 16 to the measurement unit 22, the acceptable limits of the signals to be evaluated, and the type of display to be produced.

To implement the system, the computer 10 is provided with an output bus 24 interconnected with the stimulus unit 18 hereinafter described in more detail in FIGS. 2-12, the measurement unit 22 hereinafter described in more detail in FIGS. 13-15, and the switching circuit 20. The switching circuit 20 may be any suitable conventional switching circuit, desirably solid state, which is operable under the control of the computer 10 to connect the output signals from the stimulus unit 18 to the unit 16 under test and the output signals from the unit 16 under test to the measurement unit 22 for measurement purposes. The measurement unit 22 is directly connected to the computer 10 by way of an input bus 26.

In the preferred mode of operation, the operator utilizes the control unit 12 to cause the computer 10 to select the appropriate program for the unit 16 to be tested. The selection of the program will be displayed to the operator by the display unit 14 for conformation and the computer then activated by the operator to begin the test routine of the program selected.

The program responsive signals from the computer 10 will be used to address and effect the operation of the various components of the stimulus unit 18 to cause the generation of the appropriate a.c. and d.c. signals to be applied through the switching circuit 20 to the unit 16 under test. The response of the unit 16 under test is fed back through the switching circuit 20 to the measurement unit 22. The measured values are then applied to the computer 10 for evaluation in specific units thereof against the particular values dictated by the computer program. The results of the computer evaluation may be stored in the computer for subsequent display by the display unit 14.

The operation of the various components of the system as preferably embodied is hereinafter explained in greater detail in accordance with the following Table of Contents:

TABLE OF CONTENTS

1. Stimulus Unit (FIG. 2)
   A. Isolation (FIGS. 3 and 3(A))
   B. Controller (FIGS. 4 and 5)
   C. D/A 1 (FIGS. 6 and 7)
   D. D/A 2 (FIG. 8)
   E. D/As 3 and 4 (FIG. 9)
   F. D/A 5 (FIG. 10)
   G. D/Ss 1 and 2 (FIGS. 11 and 12)
2. Evaluation Unit (FIG. 13)
   A. Signal Conditioner (FIG. 14)
   B. Demodulator (FIG. 15)
   C. Operation (FIGS. 13, 14 and 15)

1. STIMULUS UNIT

With reference now to the block diagram of FIG. 2, the digital signals from the computer 10 are applied to an input terminal 28 of the stimulus unit 18 of FIG. 1 where they are applied through an isolation circuit 30 to the controllers 32 and 34 associated respectively with a pair of digital to analog converters 36 and 38. These signals from the computer are also applied to the controllers 40-50 associated respectively with digital to analog controllers 52-56, and digital to synchro converters 58 and 60.

The digital to analog converters 36, 38 and 52-56 and the digital to synchro converters 58 and 60 are each directly connected to an associated output terminal 66-78 which is, in turn, directly connected to the input terminals of the switching circuit 20 of FIG. 1. A d.c. and an a.c. reference voltage generator 62 and 64, respectively, are provided and the input signal from the d.c. generator 62 is directly connected to an input terminal 80 of the switching circuit 20. The output signal from the a.c. generator 64 is fed directly to an output terminal 82 of the switching circuit 20 and also through transformers 90-94 to output terminals 84-86 to provide the various a.c. signals hereinafter described.

The d.c. generator 62 may be any suitable commercial source of direct current and provides a regulated supply of 28 volt potential in the present embodiment.

The a.c. generator 64 may likewise be any suitable commercial source of alternating current and provides, in the preferred embodiment, a 115 volt signal at a frequency of 400 Hertz. The transformers 90-94 are conventional and are utilized to introduce appropriate relative phase shifts and to provide a three phase supply.

While not shown in FIG. 2, the d.c. and a.c. generators 62 and 64 may be connected to the output box 24 of the computer 10 and provided with appropriate decoding logic circuitry so that the computer 10 may selectively control the energization thereof.

In operation, the isolation circuit 30 hereinafter more fully described in connection with FIG. 3 isolates the +5/0 volt signals from the computer 10 from the controllers associated with the digital to analog converters 36 and 38. The controllers receive 10 bits of +5/0 volt value information as well as 6 bits of address information from the computer. The 10 value information bits are passed to the digital to analog converter to control the value of the analog output signal therefrom. The controller unit also receives both d.c. and a.c. reference input signals, selects the polarity thereof, and makes the reference signal available to the digital analog converter as appropriate under the direction of the computer 10. The controller units 32, 34 and 40-46 for each of the digital to analog converters 36, 38 and 52-56 are substantially identical and are the same as the controllers 48 and 50 associated with the digital to synchro converters 58 and 60.

A. ISOLATION

With reference now to FIG. 3, the isolation circuit 30 of the stimulus unit 18 illustrated in FIG. 2 comprises a bi-phase transmitter 96 and receiver 98. The direct current isolation achieved obviates the necessity for referencing both ends of the transmission line 100 to ground potential.

As illustrated in FIG. 3, the transmitter comprises a decode unit 102, a storage register 104, a phase inverter 106 and a pulse generator 108. The decode unit 102 is connected to receive a six-bit address word from the output bus 24 of the computer 10. The decode circuit 102 is conventional in its circuitry and operates, when properly addressed by the computer 10, to generate a signal on line 109 which is utilized to enable the storage register 104.

The storage register 104 is also connected to the input terminal 112 on the bus 24 and receives a four-bit address word and a sixteen-bit value word. As noted in FIG. 2, the isolation circuit 30 is utilized to isolate the controllers 32 and 34 of the digital to analog converters 36 and 38 from the computer 10 output bus 24. The four-bit address word loaded into the storage register 104 is required to differentiate between the controllers 32 and 34 of the two digital to analog converters 36 and 38.

The circuitry and operation of the storage register 104 is conventional and will not be described in detail. The storage register 104, when enabled by the decode circuit 102, provides twenty bits of serial data to the phase inverter 106 which receives the output signal from the conventional pulse generator 108. The pulses from the generator 108 may be any appropriate shape but conveniently each comprise a positive pulse followed by a negative pulse, as indicated in waveform (a) of FIG. 3 (A). The passage of a positive pulse followed by the negative pulse through the phase inverter 106 without a phase reversal or polarity inversion is utilized to indicate a binary logic ONE. The enabling of the phase inverter 106 to invert or phase reverse the signal from the generator 108 to produce a negative pulse followed by a positive pulse is utilized to indicate a binary logic ZERO. The exemplary waveforms are illustrated in FIG. 3 (A) wherein the output signal of the generator 108 is illustrated as waveform (a), the serial output signal of the storage register 104 is indicated as waveform (b), and the resultant output signal from the phase inverter 106 is illustrated as waveform (c).

The output of the phase inverter 106 is fed over the line 100 to the receiver 98 which comprises a phase detector 110, a pulse generator 112 and a storage register 114. The phase detector 110, pulse generator 112 and storage register 114 are all conventional in operation. The detector 110 is utilized to control the phase of the binary pulses generated by the generator 112 and serially loaded into the storage register 114. Storage register 114 is utilized for reconverting the serial binary output signal from the pulse generator 112 to a parallel form for utilization by the controllers 32 and 34 associated, respectively, with the digital to analog converters 36 and 38 of FIG. 2. Appropriate and conventional timing circuits (not shown) are required to synchronize the clocking of the storage registers 104 and 114 with the pulse generators 108 and 112. The output signal from the storage register 114 constitutes the three-bit address word utilized to distinguish between the controllers 32 and 34 as well as the sixteen-bit value word to be applied to the digital to analog converters 36 or 38.

B. CONTROLLER

With reference now to the controller circuit illustrated in FIG. 4, the three-bit address word from the isolation circuit 30 of FIG. 6 (or the six-bit address word from the computer 10 when the optional isolation circuit 30 is not utilized) are applied in parallel to suitable conventional address logic circuitry 117 to provide an enabling signal over line 118 to a storage register 120 which receives the +5/0 volt binary signals, a 10 bit value word and a 6 bit control word. The circuitry and operation of the storage register 120 is conventional and, when enabled, the storage register 120 provides at its output terminals, a 6 bit 5 volt word, a 1 bit 5 volt control word utilized to control the operation of polarity switches 122 and 124, and a 1 bit 5 volt control word utilized to control the operation of a reference switch 126 whereby one of two reference signals are applied from the output terminals 132 and 134 of suitable conventional sources (not shown) to the polarity switches 122 and 124. Ten bits of the 5 volt word are applied from the storage register 120 to an interface circuit 128, hereinafter described more completely in connection with FIG. 5, for conversion to 15 volt logic levels and application to output terminals collectively indicated at 130.

With continued reference to FIG. 4, the reference voltages applied to the terminals 132 and 134 are selected by the program of the computer 10 as appropriate for the function which the digital to analog converters and digital to synchro converters of the stimulus unit 18 are to perform. The reference switch 126 itself may be any suitable circuit for applying current through a relay coil 136 to effect control in a conventional manner over a switching arm 138. The coil 136 of the relay may be paralleled by a diode 140 for transient suppression, if desired. The reference switch 126 and associated relay may be replaced as desired by appropriate solid state switching.

The single bit polarity control word is applied from the storage register 120 directly to one polarity switch 122 and through a conventional inverter 142 to the second polarity switch 124 so that the enabling of the two polarity switches 122 and 124 is mutually exclusive. With the application of a negative bit to the emitter electrode, NPN transistor Q1 saturates to ultimately control the operation of the field effect transistor FET 1. The output signals from both of the polarity switches 122 and 124 are fed through an OR gate 144 to provide, on output terminal 146, the reference output signal utilized by the associated digital to analog or digital to synchro converter. The circuitry of the polarity switch 124 may be identical for that of the polarity switch 122 and exemplary values for the various circuit components are as follows:

| | |
|---|---|
| Q1 | EN 2222 |
| Q2 | EN 2222 |
| Q3 | EN 3502 |
| Q4 | 2N 2945A |
| FET 1 | U1 897E |
| R1 | 20 K ohms |
| R2 | 2.2 K ohms |
| R3 | 8.2 K ohms |
| R4 | 15 K ohms |
| R5 | 100 K ohms |
| R6 | 15 ohms |
| R7 | 1000 K ohms |
| D1 | IN 4446 |
| D2 | IN 4446 |

The interface circuit of FIG. 4 is illustrated schematically in more detail in FIG. 5 and comprises a plurality of identical sectons, each energized by a positive 15 volt and a negative 15 volt direct current source (not shown). The +5/0 volt binary signals from the storage register 120 of FIG. 4 are applied to the respective input terminals 148 associated one to each of the sections.

Each of the sections comprise transistors Q5, Q6 and Q7, a diode D4, and appropriate biasing resistors R8 – R11. The signal at the corresponding output terminal 150 is a 15 volt logic binary signal and is effectively controlled by the 5 volt logic signal applied to the corresponding input terminal 148. The removal of a positive signal from the emitter electrode of NPN transistor causes the successive conduction of transistors Q5, Q6 and Q7 to apply the +15 volt potential through the diode D4 and transistor Q7 to the output terminal 150. When the transistor Q7 is not conducting, the −15 volt potential is applied to the output terminal 150 through the resistor R11. The signals on the terminals 150 comprise the output signals from the collective terminal 130 (FIG. 4) of the controllers 32, 34 and 40–50 to the digital to analog or digital to synchro converters, as appropriate.

Exemplary values for the various circuit components illustrated in FIG. 5 are as follows:

| | |
|---|---|
| Q5 | EN 2222 |
| Q6 | EN 2222 |
| Q7 | EN 3502 |
| D3 | IN 4446 |
| R8 | 20 K ohms |
| R9 | 2.2 K ohms |
| R10 | 8.2 K ohms |
| R11 | 100 K ohms |

The reference signals applied to the input terminals 132 and 134 of the typical controller of FIG. 4 may differ with the digital to analog and digital to synchro converters, as will hereinafter be explained. These sources (not shown) of these reference signals are, however, conventional and selected as appropriate for the signal to be generated for application to the unit under test 16.

C. DIGITAL TO ANALOG CONVERTER NO. 1

With reference to FIG. 6 where the digital to analog converter 36 (D/A 1) of FIG. 2 is illustrated in greater detail, the 10 bit 15 volt value word from the output terminal 130 of the controller 32 of FIG. 4 is applied to a switch logic circuit 152 which also receives a negative 5 volt direct current reference signal from the controller output terminal 146. As will be explained infra in connection with FIG. 7, the 10 bit 15 volt value word is utilized to control the application of the negative 5 volt reference signal on terminal 146 to a gain control network 154. The gain control network 154 may comprise a conventional resistance ladder network in which various resistors may be selectively switched into and out of the circuit and will not be hereinafter described.

The output signal from the gain control network 154 is a d.c. voltage which varies from 0 – 5 volts and which is applied to one input terminal 155 of the comparator 156. The output terminal of the comparator 156 is directly connected to a suitable electronic switch 158 in the line 160 between a conventional 120 volt regulated d.c. power supply 162 and a capacitor 164. An inductor 166 may, if desired, be added in series with the capacitor 164 to suppress the transients normally associated with the operation of a switch.

A potentiometer 168 connected in parallel across the capacitor 164 may be utilized to pick off a feedback voltage which is applied to the other input terminal 170 of the differential amplifier 156.

The voltage accumulated on the capacitor 164 is applied to the output terminal 66 of the digital to analog converter 36 either directly over a line 172 or through a conventional inverter 174 under the control of a suitable switch 176. Polarity control of the output signal may thus be achieved by control of the switch 176 by a single bit 5 volt control word derived from the collective terminal 178 of the digital to analog controller 32 of FIG. 4.

In operation, a 10 bit value word of 15 volt digital logic is received from the controller 32 on the input terminal 130 is utilze to selectively control the application of the negative 5 volt reference signal from the terminal 146 to the gain control network 154, thereby establishing a voltage level related to the 10 bit word. This voltage level is applied to one input terminal 155 of the comparator 156 which may comrpise a differential amplifier.

Assuming no voltage on the capacitor 164, and thus no output signal appearing at the output terminal 66, the differential amplifier 156 will enable the switch 158 effectively connecting the 120 volt d.c. power supply 162 to the capacitor 164. As the capacitor 164 charges from the 120 volt power supply 162, a proportional potential is picked off the potentiometer 168 and applied to the other input terminal 170 of the differential amplifier 156. Upon cancellation or equalization of the two voltages applied to the input terminals 155 and 170 of the differential amplifier 156, the output signal from the differential amplifier will be lost, the switch 158 disabled and the 120 volt power supply 162 disconnected from the capacitor 164. As dictated by the single bit 5 volt control word applied to terminal 178, the potential across the capacitor 164 will be reflected with the proper polarity at the output terminal 66 of the digital to analog converter 36.

The switch logic circuit 152 of FIG. 6 may be of the type illustrated in FIG. 7 wherein only the first of ten identical sections is schematically illustrated. With reference now to FIG. 7, a bit of the 15 volt value word is applied to the appropriate one of the input terminals 130 to control the operation of the PNP transistor Q8 and thus ultimately the operation of the field effect transistor FET 2 from which the output signal for that section is taken. This output signal is applied by way of a terminal 178 to the resistance ladder of the gain control network 154 of FIG. 6.

Exemplary values for the various circuit components schematically illustrated in FIG. 7 are as follows:

| | |
|---|---|
| Q8 | 2N 2945A |
| FET 2 | U1 897E |
| D4 | IN 4446 |
| D5 | IN 4446 |
| R12 | 1000 K ohms |
| R13 | 15 ohms |
| R14 | 56 K ohms |

D. DIGITAL TO ANALOG CONVERTER NO. 2

The digital to analog converter 38 (D/A 2) of FIG. 2 is illustrated in more detail in FIG. 8. With reference to FIG. 8, a plus or minus 5 volt reference signal is applied to the input terminal 146 from the like numbered output terminal of the controller 34 of FIG. 4 under the direction of the computer 10. This reference signal is passed through the switch logic circuit 180 under the control of the 15 volt 10 bit value word as passed through the interface circuit 128 of FIG. 5. The output signals from the switch logic circuit 180 are applied to the resistance ladder of the gain control network 182. Both the switch logic 180 and gain control networks 182 illustrated in block form in FIG. 8 may be identical to those circuits earlier described in connection with the digital to analog converter 38 illustrated in FIG. 6.

The output signal from the gain control network 182 is thus a voltage level which changes incrementally with the changing of the 10 bit value word from the computer 10. This voltage level is passed by way of the normally closed contacts 184 of a mode control relay 186 through an amplifier 188 to a voltage output terminal 68. The amplifier 188 is provided with mutually exclusive feedback paths through the normally closed contacts 190 of a range relay 192 or the normally open contacts 194 of the same range relay 192, whereby different values of resistance may be selectively utilized for signal attenuation.

The mode conrol relay 186 and the range control relay 192 may be of the type earlier described in connection with the reference switch relay 126 of the digital to analog controller of FIG. 4 and are operative under separate single bit 5 volt logic control words available from the controller of FIG. 4 on the output terminal 178.

The mode control relay 186 has two additional contacts 196 and 198 normally open in the voltage mode. The contacts 196 isolate the output terminal 200 of the gain control network 182 from ground potential and the contacts 198 isolate a current amplifier 202. When in the current mode, the closed contacts provide a current path through the amplifier 202 to the current output terminal 68, the open contacts 184 disconnect the voltage amplifier 188 from the terminal 200, and the closed contacts 196 ground the resistor 197 to establish a voltage source at terminal 200 from which current can be drawn.

E. DIGITAL TO ANALOG CONVERTERS NOS. 3 & 4

With reference to FIG. 9, where a typical circuit for both of the digital to analog converters 52 and 54 is illustrated, a 2.5 volt, 400 Hertz a.c., or positive or negative 5 volt d.c., reference signal is selectively applied to an input terminal 146 of the switch logic circuit 204 under the control of the appropriate controller 42. The 10 bit, 15 volt digital value word available from the output terminal 130 of the controller of FIG. 4 controls the application of the appropriate reference signal from the terminal 146 to the resistance ladder of the gain control network 206 to produce an output signal on terminal 208.

This signal is amplified in an amplifier 210 and applied to a ranging circuit 212. The amplifier 210 is provided with a d.c. feedback path through the normally open contacts 214 of a mode relay 216. A second and a.c. feedback path is provided through the normally closed contacts 218 of the same mode relay 216. Both the a.c. and d.c. feedback paths may contain two resistors 220 and 222 of different values operably connected by means of the mutually exclusive contacts 224 and 226 of a range relay 228.

The output signal from the amplifier 210 may alternatively be passed through the normally closed contacts 229 of the same mode relay 216 to an output terminal 230 to provide a 0-5 volt a.c. suppressed carrier, or through the normally open contacts 232 of the same mode relay 216 directly to the 0-1/0-10 volt d.c. output terminal 234. This signal is applied alternatively through the normally closed contacts 236 to the 0-1/0-10 volt a.c. output terminal 238 on the secondary winding of an output transformer or through the normally open contacts 240 of the same relay to the 0.10/0.100 volt a.c. output terminal 242 on a different secondary winding of the transformer. An input terminal 244 and two switch contacts 246 and 248 of a second mode relay 219 provide the return signal path. The output terminals 230, 234, 238 and 242 are illustrated collectively as the output terminals 70 and 72, respectively, of the digital to analog converters 52 and 54 of FIG. 2.

The operation of the d.c. range switch 250, the mode switch 252 and the a.c. range switch 254 are each individually controlled by a single bit 5 volt control word available from the output terminal 178 of the controller 40 or 42 of FIG. 4.

F. DIGITAL TO ANALOG CONVERTER NO. 5.

As indicated in the stimulus section of FIG. 2, the digital to analog converter No. 5 is provided with two controllers 44 and 46. As indicated in FIG. 10, the purpose of the additional controller is to duplicate the switching logic and gain control networks with the addition of a phase shifter so that the single ranging circuit may receive both in-phase and quadrature signal components.

With reference to FIG. 10, the switch logic 256 receives the 10 bit 15 volt value word from the output terminal 130 of the controller 46 and a 400 Hertz, 2.5 volt reference signal from the output terminal 146 of the same controller. The output signals from the switch logic circuit 256 are applied through the gain control network 258 to an output terminal 260.

The 10 bit 15 volt value control word from the terminal 130 of the controller 44 of FIG. 2 is applied in parallel to the switch logic circuit 262. A 400 Hertz, 2.5 volt reference signal is applied from the output terminal 146 of the controller 44 through a phase shift circuit 266 to the switching logic circuit 262. The output signals from the switching logic circuit 262 are applied to the gain control network 264 to produce an output signal which is displaced in phase by 90° from the signal from the gain control network 258. This signal is applied to the terminal 260 for combination with the in-phase output signal of the gain control network 258.

The combined signals are applied to a ranging circuit 268 to produce on the output terminals 270-276, respectively, a 0-0.5/0-5 volt a1c. signal, 0-1/0-10 volt d.c. signal, 0-1/0-10 volt a.c. signal, and 0-10/0-100 volt a.c. signal, all variable in phase.

The switching logic circuits 256 and 262 are identical in circuitry and operation to the switching logic circuits 180 and 204 earlier described. Likewise, the gain control networks 258 and 264 are identical in circuitry and operation to the gain control networks 206 and 182 earlier described. The ranging circuit 268 is identical to the ranging circuit 212 of the digital to analog converters 3 and 4 illustrated in FIG. 9 and receives from the output terminal 178 of one of the controllers 44 or 46 three single bit control words fro the d.c. range switch, the mode switch and the a.c. range switch described in connection with FIG. 9.

In operation, the quadrature signals combine in amplitude to produce an a.c. signal having a phase related to the then current value word provided by the program of the computer 10. The ranging circuit is operative to provide the various ranges desired.

G. DIGITAL TO SYNCHRO CONVERTERS NOS. 1 & 2

The two digital to synchro converters 58 and 60 illustrated in block form in FIG. 2 are identical in circuitry and operation and are illustrated in more detail in FIGS. 11 and 12.

With reference now to FIG. 11, a 7 bit 15 volt control word is supplied from the output terminal 130 of the associated controller 48 or 50 of FIG. 4 simultaneously to the switching logic circuits 278 and 280. The remaining three bits of the ten value bits available at the terminal 130 are applied to the input terminal 283 of the octant selector 282 subsequently to be described in more detail in connection with FIG. 12.

A 400 Hertz 2.5 volt rms reference signal is applied from the output terminal 146 of the appropriate controller through one of the normally open contacts 284 - 290 and the resistors 292 - 298 respectively associated therewith via a conventional amplifier 300 to the switching logic circuit 278. The reference signal from the terminal 146 of FIG. 4 is also applied through one of the normally open contacts 302 - 306 and the resistors 308 -

312 respectively associated the rewith via a conventional amplifier 314 to the switching logic circuit 280.

The switching logic circuits 278 and 280 are identical to those earlier described with the exception that only seven of the ten sections are utilized. The output signals from the switching logic circuits 278 and 280 control, respectively, the operation of the gain control networks 316 and 318 in the manner earlier described in connection with the digital to analog converters 36, 38 and 52 – 56.

The output signal from the gain control network 318 is combined with the output signal from the amplifier 300, amplified in a conventional amplifier 320 and applied as a $\cos \theta$ signal to an input terminal 322 of the octant selector 282. The output signal from the amplifier 320 is also applied as a negative $\cos \theta$ signal to an input terminal 324 of the octant selector 282 by way of a conventional inverter 326.

In a similar fashion, the output signal from the amplifier 314 is applied by way of the normally closed contacts 328 to a conventional amplifier 330 where it is combined with the output signal from the gain control network 316. The output signal from the amplifier 330 is applied to an input terminal 332 of the octant selector 282 as a $\sin \theta$ signal and is inverted in a conventional inverter 340 and applied to an input terminal 342 as a negative $\sin \theta$ signal.

A 2 bit, 5/0 volt, control word from the output terminal 178 of FIG. 4 is applied to a suitable conventional logic circuit 344 which controls the operation of the previously mentioned relay contacts 302 – 306, 284 – 290, 328 and 336. In addition, the logic circuit 344 controls the operation of normally open contacts 346 which are effective, when closed, to ground the input terminal of the amplifier 330, thereby effecting a $\sin \theta = -\sin \theta$ = zero signal at the input terminal 332 of the octant selector 282.

One additional bit of the 5/0 volt signals from the output terminal 178 of the controller of FIG. 4 is applied by way of a line 348 to an input terminal 350 of the octant selector 282. The octant selector 282 is connected by a way of terminals 352 and 354 to a transformer 356 having three output terminals 358 - 362 as will be described in more detail in connection with FIG. 12.

With reference now to FIG. 12, the positive and negative $\sin \theta$ and $\cos \theta$ signals from the like numbered terminals of FIG. 11 are applied respectively to the input terminals 332, 342, 322 and 324 of the octant selector 284 in digital to synchro converter 60 of FIG. 2. The same four signals are derived from a circuit identical to that illustrated in FIG. 11 and are applied to like numbered terminals of the octant selector 282 associated with digital to synchro converter 58 of FIG. 2. Also applied to the octant selectors 282 and 284 from the respective controllers 48 and 50 is the 3 bit, 15 volt, octant switch control word from the output terminal 350, and the 1 bit, 5/0 volt, range switch control word from the terminal 283. The 1 bit, 5/0 volt and 3 bit, 15 volt control words are applied, respectively, to a suitable conventional octant switch logic circuit 366 and range switch logic circuit 368 which operate to effect control of the switch contacts to be described infra.

With reference to the octant selectro 284 associated with the digital to synchro converter 53, and with continued reference to FIG. 12, the positive and negative $\sin \theta$ and $\cos \theta$ signals are applied by way of normally open contacts 370 – 376 of the octant selector switch logic 366 to an amplifier 378. The output signal from the amplifier 378 is applied to the input terminal 354 of the transformer 356 of FIG. 11. The amplifier 378 is also provided with a pair of feedback paths including different resistance values and normally closed relay contacts 380 and 382 and normally open contact 384 associated with previously mentioned range switch logic circuit 368.

The positive and negative $\sin \theta$ and $\cos \theta$ signals from the terminals 332, 342, 322 and 324 are also applied by way of normally open relay contacts 386 – 392 and the resistors associated therewith to the input terminal of an amplifier 394 whose output terminal is connected to the other input terminal 352 of the transformer 356 of FIG. 11. The amplifier 394 is also provided with two feedback paths containing different resistive values for range attenuation purposes. The feedback paths contain normally closed relay contacts 396 and 398 and normally open contacts 400 associated with the range switch logic circuit 368 earlier described.

The transformer 356 of FIG. 11 includes four separate windings in the digital to synchro converter 60 of FIG. 2. These windings have different numbers of turns and are selectively connected to the input terminals 352 and 354 by way of switch contacts 402 – 408 associated with the range switch logic circuit 368. The output windings of the Scot T transformer 356 are likewise connected by way of switch contacts 410 – 416 responsive to the range switch logic circuit 368 to alternatively provide a 11.8 volt or 90 volt line-to-line maximum 3-wire synchro signal on the output terminals 358 – 362.

As previously mentioned, the octant selector 282 associated with the digital to synchro converter 60 is identical to that associated with the digital synchro converter 58. However, the transformer 356 of the digital to synchro converter 60 contains only two windings and the 3-wire synchro output signals therefrom on the terminals 357 – 359 are 11.8 volts or 13.2 volts, as determined by the range switch logic of the associated octant selector 282.

In operation, and with reference to FIG. 11, the switch contacts 284 – 290, 302 – 306 and 336 are operated in pairs and correspond to angles of 0°, 11.25°, 22.5° and 33.75°. The 400 Hertz, 2.5 volt rms reference signal on the terminal 146 is fed through the switch logic circuits 278 and 280 to the resistance ladder network of the gain control networks 316 and 318. The $\sin \theta$ signal is fed back via line 334 where it is summed in the amplifier 314 with the reference signal, and this combined signal is combined in the amplifier 330 with the gain adjusted output signal of the amplifier 300. The output signal of the amplifier 314 is also modified in amplitude and combined with the output signal from the amplifier 300 to produce the $\cos \theta$ signal.

The $\sin \theta$ and $\cos \theta$ are thus signals related in amplitude to the value of the sine and cosign of the phase angle $\theta$. The relative amplitudes of the three phases of the output signal of the transformer 356 are indicative of the desired angle and the switches of the switch logic circuit 278 and 280 provide a least increment of 5.25 minutes.

These signals are fed to the octant selector of FIG. 12 where the octant is selected by the 3 bit word applied to the octant switch logic circuit 366 and the desired range determined by the 1 bit control word applied to the range switch logic circuit 368.

2. MEASUREMENT UNIT

As earlier described in connection with FIG. 1, the measurement unit 22 receives signals from the computer 10 indicative of the particular circuit to be applied the signals generated by the unit 16 under test and supplied to the measurement unit 22 by the switching circuit 20. The results of this measurement are fed to the computer 10 via the input bus 26 to be subsequently evaluated and displayed to the operator by the display unit 14. The measurement unit 22 of FIG. 1 is illustrated in greater detail in FIG. 13.

With reference now to FIG. 13, the measurement unit 22 receives the analog signals generated by the unit 16 under test together with a 400 Hertz reference signal from the switching circuit 20 on an input terminal 420 and receives the digital signals from the computer 10 over the output bus 24. The signals from the measurement unit 22 are applied to the computer 10 via an output terminal 422 directly connected to the input bus 26 of the computer 10.

The digital signals from the computer 10 are applied in parallel to appropriate decode circuits 424 and 426. The decode circuit 426 receives a 6 bit address word from the computer 10 together with a 2 bit control word of 5/0 volt signals. If properly addressed for a synchro input signal, the decode circuit 426 passes the 2 bit control word to the synchro to digital converter 428 to control the operation thereof. The decode circuits 424 and 426 may be conventional logic circuitry conventional in operation. The synchro to digital converter 428 may also be conventional and may be, for example, of the type available from Data Devices Company of 100 Tec Street, Hicksville, New york as Model ESDC-L-3.

The synchro signals applied from the unit 16 under test via the switching circuit 22 to the sunchro to digital converter 428 are adjusted in amplitude to an 11.8, 13.2 or 90 volt range for application to the input bus 26 of the computer 10. The output signal from the synchro to digital converter 428 is a 6 bit, 5/0 volt word containing 14 value bits and 2 bits of range information.

The decode circuit 424 is supplied with a 6 bit, 5/0 volt, address word and a 6 bit, 5/0 volt control word. When properly addressed for other than a synchro input signal, the decode circuit 424 produces a 6 bit control word for application to a control logic circuit 430. This 6 bit, 5/0 volt, control work contains a 2 bit word indicative of one of four ranges and a 4 bit control word indicative of the mode of operation, i.e., a.c., d.c., phase, resistance or current measurements. This 6 bit control word is applied to a signal conditioner circuit 432 which also receives a 400 Hertz reference signal from the switching circuit 20 together with the analog signal to be measured.

The signal conditioner 432 operates in a manner described infra in connection with FIGS. 14 and 15 to produce an analog output signal. This output signal from the signal conditioner circuit is applied to an analog to digital converter 434 which may be any suitable and conventional circuit such as the Series 2110 available from Datum, Inc., 170 East Liberty Street, Anaheim, California 92801, which operates at a 30 KHz sample rate to digitize the analog signal into a 16 bit, 5/0 volt, word acceptable to the computer 10. Eleven of the 16 bits are value information, 2 bits indicate range and 3 bits are indicative of mode. These signals are applied to the computer 10 over the input bus 26 as earlier explained in connection with FIG. 1.

A. THE SIGNAL CONDITIONER

The signal conditioner circuit 432 of FIG. 13 is illustrated in greater detail in FIG. 14 wherein the 2 bit, 5/0 volt, range control word from the control logic circuit 430 of FIG. 13 is applied to a suitably and conventional range control network 438 by way of an input terminal 436. The range control circuit 438 may comprise any resistance network, the attenuation of which is programmable.

The range control circuit 438 also receives the analog signal to be measured from the terminal 420. The output signal from the range control circuit 438 is a 0 to 5 volt analog signal and is applied With a continued reference to FIG. 14, three bits of the 4 bit mode control work are also applied from the terminal 436 of the control logic circuit 430 of FIG. 13 to the demodulator circuit 440. The 400 Hertz reference signal from the switching circuit 20 of FIG. 1 is applied by way of the terminal 420 to the demodulator circuit 430 where measurements as to phase, suppressed carrier and unfiltered a.c. or d.c. are made in accordance with control word from the control logic circuit 430 of FIG. 13.

The output signals from the demodulator circuit 440 are fed through a low pass filter 444 to the terminal 446 of the analog to digital converter 434 of FIG. 13. The low pass filter 444, like the filter 442, may be of the conventional Butterworth type, programmable, and desirably flat in its response to approximately 1 kilohertz. A switch 445 also receives a single bit of the 4 bit control word from the control logic circuit 432 of FIG. 13 to control the energization thereof and the operation of switch contacts 447 and 449. The output signal from the filter 442 or the filter 444, as appropriate, is applied directly to the input terminal 446 of the analog to digital converter 434 of FIG. 13.

B. DEMODULATOR

The demodulator 440 of FIG. 14 is illustrated in greater detail in FIG. 15 wherein the 400 Hertz reference signal from terminal 420 is applied to a suitable and conventional square wave generator 448 which produces a 400 Hertz square wave output signal. This enabling square wave signal is applied to a pair of polarity switches 452 and 454 which receive the 0 to 5 volt analog signal from the terminal 450 of the range control circuit 438 of FIG. 14. The output signal from the enabled one of the polarity switches 452 and 454 is applied to the input terminal of a conventional variable gain amplifier 456 whose output signal is applied to a terminal 458 of the low pass filter 444 of FIG. 14.

Three bits of the 4 bit mode control word from the control logic circuit 430 of FIG. 13 are applied by way of terminal 436 to the amplifier 456 to control the gain thereof.

C. OPERATION

In operation, and assuming a d.c. input signal from the unit 16 under test via the switching circuit 22 of FIG. 1 on the terminal 420 of FIG. 13, this d.c. signal is adjusted in range and fed through the active Butterworth filter 442 by way of the output terminal 446 of FIG. 14 and the analog to digital converter 434 of FIG. 13 to the terminal 422 on the input bus 26 of the computer 10.

If a suppressed carrier a.c. signal is fed into the measurement unit via the input terminal 420 of FIG. 13, the signal is amplified and applied to the demodulator circuit 440 for measurement of 0.1 to 10 cycle modulation. The square wave output signal from the square wave generator 448 of FIG. 15 is effective to pass or to invert the 400 Hertz reference signal. If the input signal on the terminal 450 is in phase with the reference signal on the terminal 420, the output signal on terminal 458 will be a positive full wave rectified signal. If the input signal is 180° out of phase with the reference signal, the output signal on the terminal 458 will be a negative full wave rectified signal. The filter 444 is an active Butterworth filter flat in its frequency responseout to 10 cycles and having a 3 d.b. point at 20 cycles. If this filter is switched into the circuit by the control bits from terminal 436 of FIG. 14, it will take out the 400 cycles and leave only the modulation, i.e., a suppressed carrier signal. The a.c. output signal from the filter 444 is applied to the computer 10 where it is stored for a few cycles and in the rms or average or peak value, whichever is desired, computed.

To measure the phase shift of the 400 cycle signal, the computer 10 measures the received waveform using an in-phase reference, measures the waveform using a quadrature reference, and then performs the necessary calculations to obtain the tangent of the phase shift angle. If it is desired to measure the phase shift for the modulation frequency signals, i.e., from 0 to 10 cycles, the computer 10 generated waveforms are used as a reference and the time delay initiated by the beginning of the output signal to the beginning of the input signal measured to arrive at the phase shift.

To measure a 400 Hertz signal, the output signal from the range control circuit 438 is fed through the filter 442 to the analog to digital converter 434 of FIG. 13 by way of the terminal 446. The analog to digital converter 434 tracks the analog input signal for several cycles in digital form. The computer 10 of FIG. 1 receives the digital signals via the terminal 422 (FIG. 13) and the input bus 26 (FIG. 1), and computes the desired measurement value therefrom.

The present invention may thus be embodied in other specific forms without departing from the spirit or essential characteristics thereof. The presently disclosed embodiments are, therefore, to be considered in all respects as illustrative and not restrictive, the scope of the invention being indicated by the appended claims rather than by the foregoing description, and all changes which come within the meaning and range of equivalency of the claims are, therefore, intended to be embraced therein.

What is claimed is:

1. Apparatus for testing electronic equipment comprising:
   a general purpose digital computer;
   a stimulus unit including: a plurality of digital to analog and a plurality of digital to synchro converters, each of said converters being electrically connected to said computer by a common output bus;
   a multiple lead test terminal adapted to be electrically connected to the electronic equipment to be tested;
   a measurement unit including an analog to digital converter and a synchro to digital converter, said measurement unit converters being electrically connected to said computer by a common input bus;
   a display unit electrically connected to said computer; and
   switching means responsive to said computer for selectively connecting the converters of said stimulus unit to the leads of said output terminal, and for selectively connecting the leads of said output terminal to the converters of said measurement unit.

2. The apparatus of claim 1 wherein each of the converters of said stimulus unit includes a controller responsive to said computer and
   wherein said stimulus unit further includes: a direct current generator and an alternating current generator electrically connected to said output bus, and a multiple winding transformer electrically connected to receive the output signal from said alternating current generator.

3. The apparatus of claim 2 wherein at least one of said controllers is isolated from said computer by a bi-phase transmitter and receiver.

4. The apparatus of claim 1 wherein said controllers include:
   a storage register for receiving a digital value word from said computer;
   an address logic circuit for enabling said storage register responsively to an address word from said computer;
   a reference voltage source;
   means responsive for selectively modifying the voltage of said source; and
   means for controlling the polarity of said modified voltage,
   said voltage modifying and polarity controlling means being responsive to said digital value word.

5. The apparatus of claim 1 wherein at least one of the digital to analog converters includes:
   a source of reference potential;
   a comparator;
   a switch logic circuit responsive to said computer;
   means responsive to said switch logic circuit for controlling the application of said reference potential to said comparator;
   a source of direct current;
   a capacitor;
   switch means responsive to said comparator for selectively connecting said source to said capacitor;
   means for applying a potential to said comparator related to the charge on said capacitor; and
   an output terminal for providing an output potential related to the charge on said capacitor.

6. The apparatus of claim 5 wherein said one digital to analog converter further includes means responsive to the associated controller for selectively inverting the polarity of the potential on said output terminal.

7. The apparatus of claim 1 wherein each of said plurality of digital to synchro converters comprise:
   a variable gain amplifier;
   a plurality of input elements each having a different impedance value;
   a plurality of output elements each having a different impedance value differing from the impedance values of said input elements by an order of magnitude; and
   means for selectively connecting one of said input elements and at least one of said output elements to said amplifier to control the gain thereof.

8. The apparatus of claim 5 wherein each of said plurality of digital to synchro converters comprise:
   a variable gain amplifier;
   a plurality of input elements each having a different impedance value;

a plurality of output elements each having a different impedance value differing from the impedance values of said input elements by an order of magnitude;

means for selectively connecting one of said input elements and at least one of said output elements to said amplifier to control the gain thereof; and wherein said controllers include:

a storage register for receiving a digital value word from said computer;

an address logic circuit for enabling said storage register responsively to an address work from said computer;

a reference voltage source;

means responsive for selectively modifying the voltage of said source; and means for controlling the polarity of said modified voltage, said voltage modifying and polarity controlling means being responsive to said digital value word.

9. The apparatus of claim 1 wherein each of said plurality of digital to synchro converters comprise:

a variable gain amplifier;

a plurality of input elements each having a different impedance value;

a plurality of output elements each having a different impedance value differing from the impedance values of said input elements by an order of magnitude; and means for selectively connecting one of said input elements and at least one of said output elements to said amplifier to control the gain thereof.

10. Apparatus for testing electronic equipment comprising:

a general purpose digital computer programmable with a series of digital words;

a plurality of digital to analog converters electrically connected to said computer for selectively converting a digital word into a predetermined voltage level;

a plurality of digital to synchro converters for selectively converting a digital word into three predetermined amplitude alternating current synchro signals;

a plural lead test terminal adapted to be electronically connected to the electronic equipment to be tested;

a measurement unit electrically connected to said computer, said measurement unit including an analog to digital converter for converting a voltage level into a digital word and an analog to digital converter for converting the relative amplitudes of response synchro signals into a digital word;

switching means electrically connected to said computer for selectively operably interconnecting said digital to analog converters to the leads of said test terminal and the leads of said test terminal to said measurement unit;

said computer being programmable for the equipment to be tested to control the numeric generation of a voltage waveform by said digital to analog converters, to control the numeric generation of the three synchro signals by said plurality of digital to synchro converters, to control the interconnections of said switching means, and to store digital words related to acceptable voltage response levels and related to acceptable differences in the amplitudes of the three synchro signals;

said computer being further programmable to compare both the voltage level related digital word and the synchro response related digital word generated by said measurement unit with the digital words related to the acceptable response of the equipment to be tested; and display means electrically interconnected to said computer for displaying the results of said comparison.

11. Apparatus for testing electronic equipment comprising:

a general purpose digital computer programmable with a series of digital words;

a plurality of digital to analog converters electrically connected to said computer for selectively converting a digital word into a predetermined voltage level;

a second plurality of digital to analog converters electrically connected to said computer for selectively converting a digital word into a predetermined rate of current flow;

a plural lead test terminal adapted to be electronically connected to the electronic equipment to be tested;

a measurement unit electrically connected to said computer, said measurement unit including an analog to digital converter for converting a voltage level into a digital word and an analog to digital converter for converting rate of response current flow into a digital word;

switching means electrically connected to said computer for selectively operably interconnecting said digital to analog converters to the leads of said test terminal and the leads of said test terminal to said measurement unit;

said computer being programmable for the equipment to be tested to control the numeric generation of a voltage waveform by said plurality of digital to analog converters, to control the numeric generation of a current waveform by said second plurality of digital to analog converters, to control the interconnections of said switching means, and to store digital words related to acceptable voltage response levels and related to acceptable rates of response current flow;

said computer being further programmable to compare both the voltage level related digital word and the response current flow related digital work generated by said measurement unit with the digital words related to the acceptable response of the equipment to be tested; and display means electrically interconnected to said computer for displaying the results of said comparison.

12. The apparatus of claim 7 wherein each of said plurality of digital to synchro converters comprise:

a variable gain amplifier;

a plurality of input elements each having a different impedance value;

a plurality of output elements each having a different inpedance value and differing from the impedance values of said input elements by an order of magnitude; and means for selectively connecting one of said input elements and at least one of said output elements to said amplifier to control the gain thereof.

* * * * *